(12) United States Patent
Hua et al.

(10) Patent No.: US 7,017,758 B2
(45) Date of Patent: Mar. 28, 2006

(54) WAFER PROTECTIVE CASSETTE

(75) Inventors: Tong Wei Hua, Singapore (SG); Chia Bak Hong, Singapore (SG); Zhang Jian, Singapore (SG); Tan Liang Yong, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 22 days.

(21) Appl. No.: 10/615,743

(22) Filed: Jul. 9, 2003

(65) Prior Publication Data

US 2005/0006325 A1    Jan. 13, 2005

(51) Int. Cl.
*A47G 19/08* (2006.01)

(52) U.S. Cl. .................... 211/41.18; 206/833
(58) Field of Classification Search ............ 211/41.18, 211/41.1, 40; 414/935, 941; 206/454, 832, 206/711, 710, 712, 833
See application file for complete search history.

(56) References Cited

U.S. PATENT DOCUMENTS

| | | | | |
|---|---|---|---|---|
| 4,993,559 A * | 2/1991 | Cota | .................... | 211/41.18 |
| 5,025,926 A * | 6/1991 | Gregerson et al. | .......... | 206/711 |
| 5,255,797 A * | 10/1993 | Kos | ...................... | 211/141.18 |
| 5,423,422 A * | 6/1995 | Boire et al. | ................. | 206/723 |
| 5,706,946 A | 1/1998 | Kakizaki et al. | ............ | 206/454 |
| 5,782,361 A | 7/1998 | Kakizaki et al. | ............ | 206/711 |
| 5,782,362 A | 7/1998 | Ohori | .......................... | 206/711 |
| 5,921,397 A * | 7/1999 | Whalen | ...................... | 206/711 |
| 5,960,960 A * | 10/1999 | Yamamoto | ................... | 206/711 |
| 6,099,302 A * | 8/2000 | Hong et al. | ................. | 432/259 |
| 6,168,025 B1 * | 1/2001 | Sakurai et al. | .............. | 206/711 |
| 6,341,703 B1 * | 1/2002 | Wu | .......................... | 211/41.18 |
| 6,427,850 B1 | 8/2002 | Mendiola | ................. | 211/41.18 |

* cited by examiner

*Primary Examiner*—Jennifer E. Novosad
(74) *Attorney, Agent, or Firm*—George O. Saile; Stephen B. Ackerman

(57) ABSTRACT

A substrate cassette having a conventional form, an open container having an upper entrance and a narrow lower opening formed by two side panels and two end panels. A preferred embodiment includes a train of substrate alignment channels on the inner surfaces of the two side panels, each channel is U shaped and having planar surface with a left surface, a right surface, and a bottom surface. An arcuate curbing member disposed on a left surface in each of the substrate alignment channels. The arcuate curbing member includes a top end with a thinner sloped profile facing the upper open entrance of the cassette allowing a substrate to slide through and under a stepped lower end.

16 Claims, 5 Drawing Sheets

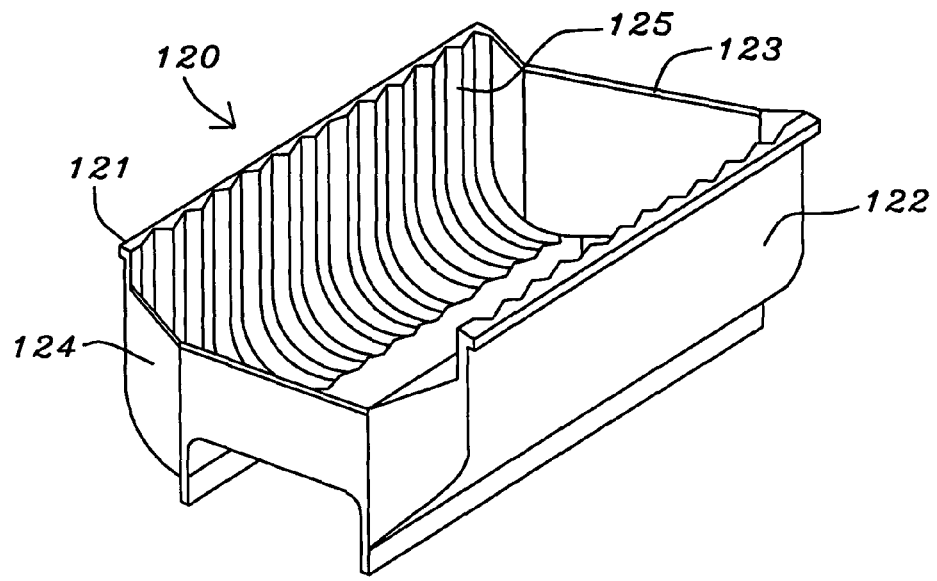
FIG. 1 – Prior Art
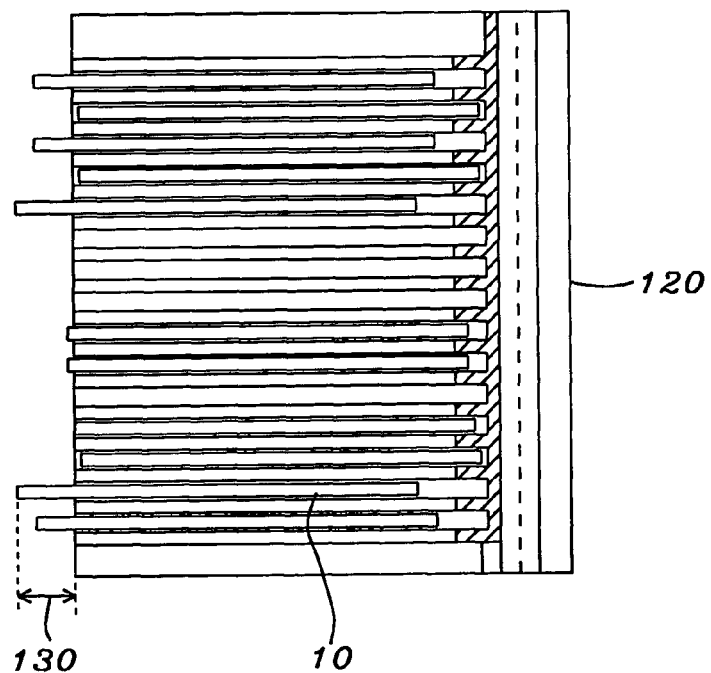
FIG. 2 – Prior Art

WAFER PROTECTIVE CASSETTE

BACKGROUND OF THE INVENTION (1) Technical Field

The present invention relates to a wafer cassette which holds a plurality of semiconductor substrates and more particularly to a cassette for containing and supporting a plurality of thin substrates such as semiconductor wafers and for storing and handling the fragile wafers, each of which are loaded and unloaded numerous times during the forming of integrated circuits therein.

(2) Description of the Prior Art

A cassette has been conventionally used for storing and supporting a plurality of fragile semiconductor substrates. The stored substrates, each of which are loaded and unloaded many times during the manufacturing process, both manually and automatically, are susceptible to damage. Cassettes are typically molded as a one-piece container is described with reference to FIGS. 1, 2 and 3, of the prior art. The cassette 120 is made in the form of an open container having only four sides with a wide opening at the top for inserting and removing substrates, and a narrower opening, relative to the outside dimensions of a substrate at the bottom of the cassette. This allows maximum exposure to process fluids while securely containing each substrate. The four sides include two side panels 121, 122 and two end panels 123, 124. Each side panel has a straight upper portion and a curved lower portion with grooves that have an elongated V shaped cross-section 125 formed within its interior surfaces. Each curved portion converges inward forming the narrower opening for the bottom; this is best illustrated in FIG. 1. In this conventional cassette 120 having the aforementioned configuration, a plurality of substrates 10 are contained in parallel with each other while guided and retained in the elongated V grooves 125.

The substrates are usually loaded or unloaded when the cassette is in a vertical position as shown in FIG. 3 illustrating a cross-sectional side view of a cassette 120 showing a common problem of the substrates 10 protruding out beyond the front opening 130 of the cassette. When the cassette is placed in a vertical position, any vibration that may be caused by a myriad of disturbances can easily cause substrates to slide out from inside the cassette to a position of exposure to damage by interfering with substrate handling hardware. This has always been a problem with conventional cassettes when handling fragile substrates. During automatic handling of substrates, by robots and the like, the fragile substrates are vulnerable to breakage during insertion or removal because of this protrusion problem.

BACKGROUND OF THE RELATED ART

The present invention is concerned with substrate damage during transportation. A plurality of substrates contained in a cassette is held in place only if the cassette is placed in a horizontal position. The substrates are reasonably secure as provided by grooves that have an elongated V shaped cross-section. The V grooves are formed on opposing inner sides of the cassette and provide a means to hold and support a plurality of substrates at various process steps throughout manufacturing. If the cassette is placed in a vertical position, any source of vibration, caused by a myriad of disturbances, can effect the position of substrates within the cassette. The substrates may jut out and be exposed to damage by interfering with handling hardware, as shown in FIG. 2. This has always been a problem with conventional cassettes when handling fragile substrates.

Typically, substrates are arranged within the cassette outside of a semiconductor process operation. The cassette is thereafter transported, with its compliment of substrates inside, to a processing station. Some processing stations are designed to process the substrates while in the cassettes. Therefore, a list of primary goals for providing a universal cassette design is as follows: a) safely contain the substrates in a stacked and space saving array. b) Allow as much access to each substrate without inhibiting processing fluids from making contact with all surfaces on a substrate. c) Have a reasonable spacing between substrates for accessing each for removal and insertion. d) Choose a cassette material that is compatible with processing chemicals and with its contents while maintaining dimensional integrity between cassettes.

Accordingly, a primary object of the present invention is to provide a curbing member that substantially reduces a substrate movement from jutting forward when a cassette is placed in a vertical position and bumped.

Another object of the present invention is to provide a channel design that allows freedom of movement for the substrate, one that does not induce stresses by overly constraining. This is common in the prior art when the substrate moves against the inner apex of the groove promoting breakage or chipping of the highly stressed edges.

Still another object of the present invention is to provide a cassette design that does not change the overall cassette dimensions or its spacing between substrates.

SUMMARY OF THE INVENTION

Accordingly, the present invention provides a solution to eliminate the abovementioned problems. To achieve the foregoing objects, in accordance with a first object of the present invention, there is provided a substrate cassette that embodies grooves, each with a curbing member that prevents substrates from jutting forward when a cassette is placed in a vertical position and bumped.

The present invention relates to a wafer cassette which holds a plurality of semiconductor substrates and more particularly to a cassette for containing and supporting a plurality of thin substrates such as semiconductor wafers and for storing and handling the fragile wafers, each of which are loaded and unloaded numerous times during the forming of integrated circuits therein.

The cassette is molded in one piece made in the form of an open container having only four sides with a wide opening at the top for inserting and removing substrates, and a narrower opening, relative to the outside dimensions of a substrate, at the bottom of the cassette. This allows maximum exposure to process fluids while securely containing each of a plurality of substrates. The four sides include two side panels and two end panels. Each side panel has a straight upper portion and a curved lower portion the curved portions converge inward forming the narrower opening for the bottom. A plurality of substrate supporting channels is molded into each interior panel surface. The channels are provided on each of the side panels of the cassette in parallel and in alignment with the supporting channels on the opposite side. The supporting channels have a slight open draft angle of about three degrees. Each channel has a molded curbing member disposed preventing a substrate from jutting forward when a cassette is placed in a vertical position and bumped.

BRIEF DESCRIPTION OF THE DRAWINGS

FIG. 1 is a top perspective view of a cassette showing a saw tooth groove pattern of the prior art.

FIG. 2 is a schematic side cross-sectional view of a plurality of wafers in a cassette of the prior art illustrating the problem of wafers protruding out of the cassette.

DETAILED DESCRIPTION OF THE PREFERRED EMBODIMENT

Figure 3:
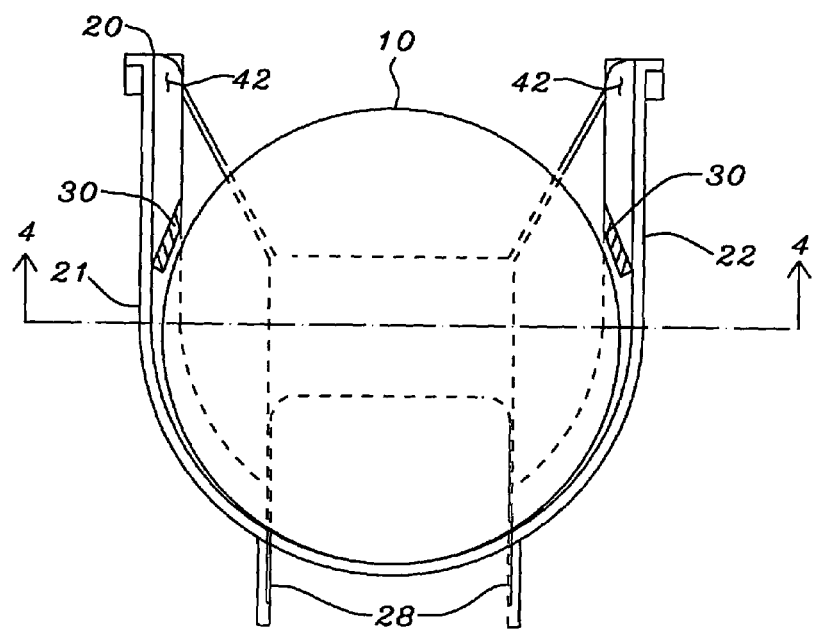
FIG. 3 is an cross-section drawing of an end view of a cassette showing a substrate retained by curbing members, of the invention.
Figure 4:
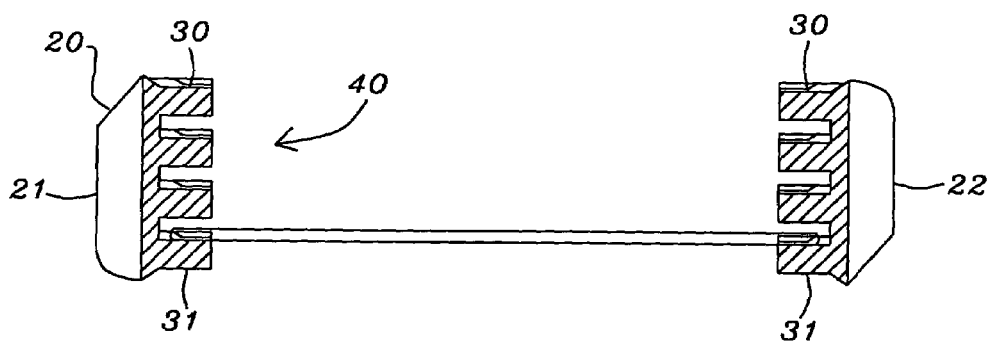
FIG. 4 is a sectional fragmented view of the cassette shown in FIG. 3, of the invention.

The present invention is concerned with substrate damage, in a cassette because of movement during transportation. Refer now to FIGS. 1 and 2 of the prior art. A plurality of substrates 10 contained in a cassette 120 are held in place only if the cassette is placed in a horizontal position, the substrates are reasonably secure by their weight and by grooves 125 that have an elongated V shaped cross-sections. The grooves are formed on opposing inner sides of the cassette and provide a means to hold and support a plurality of substrates at various process steps throughout manufacturing. When a cassette is placed in a vertical position, as illustrated in FIG. 2, vibration caused by a myriad of disturbances, may cause substrates to project out from a position within the cassette 120 into a position 130 of interference with substrate handling hardware. This has always been a problem with conventional cassettes when handling the fragile substrates.

Typically, substrates are arranged within the cassette outside of a semiconductor process operation. The cassette is thereafter transported, with its compliment of substrates inside, to a processing station. Some processing stations are designed to process the substrates while in the cassettes. The primary goals for a universal cassette design are as follows: a) safely contain the substrates in a stacked and space saving array. b) Allow access to each substrate without inhibiting process fluids from making contact with all surfaces on a substrate. c) Have a repeatable and precise spacing between substrates for accessing each for removal and insertion. d) Choose a cassette material that is compatible with process chemicals and temperatures while maintaining dimensional integrity between cassettes. e) Provide proper drainage of process fluids by having no fluid traps.

In the following particular embodiment of the substrate cassette, of the present invention, is described in detail by making reference to the accompanying drawings.

Referring now to FIGS. 3–8, of the invention, the substrate cassette 20 has a conventional form factor, that is, an open container having an upper entrance 29 and a lower cassette support opening 28 formed by two side panels 21 and 22 and two end panels 23 and 24. A preferred embodiment of the invention includes a first side panel 21 having an inner surface 38 thereof, a train 31 of substrate supporting "⌣" shaped channels 40 molded with a left surface 41, a right surface 42 and a bottom surface 43, the left and right side surfaces are within about two degrees of being perpendicular to the bottom surface that provides a slight open angle for withdrawal from molding tooling. A second side panel 22 opposite and in alignment to the first side panel 21, also with an inner surface 39 and a matching train 37 of substrate supporting channels 40.

Figure 5:
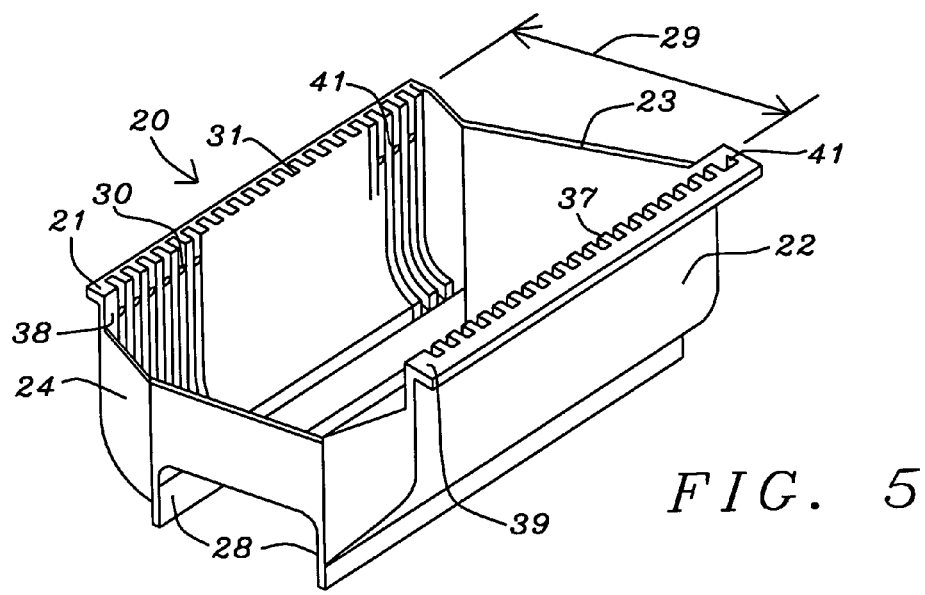
FIG. 5 is a perspective illustration of the cassette of the invention.
Figure 6:
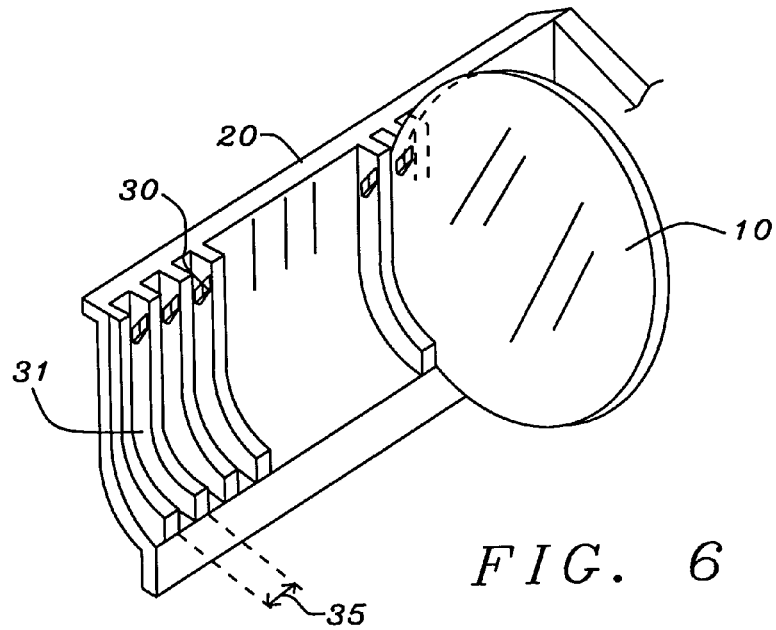
FIG. 6 is a perspective illustration showing a left side panel of the invention.
Figure 7:
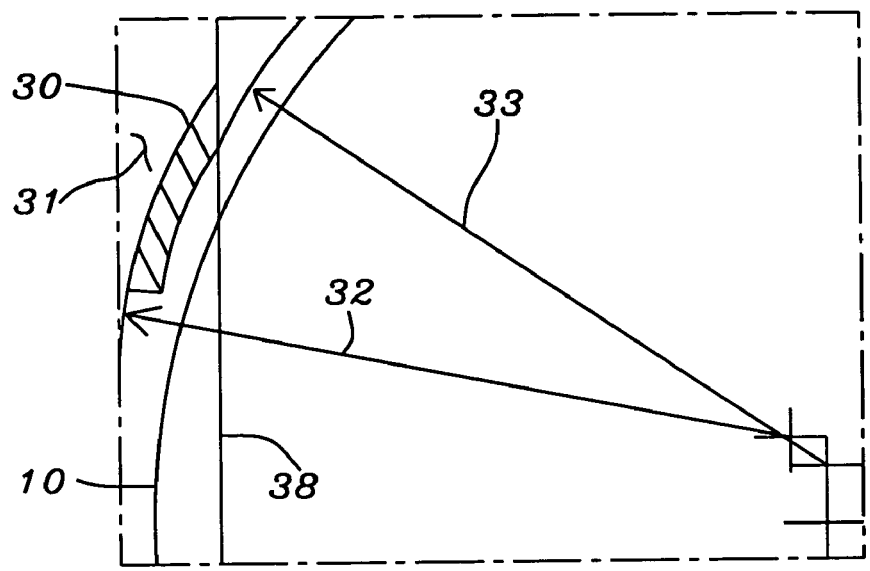
FIG. 7 is a development layout of the construction of the curbing member of the invention.
Figure 8:
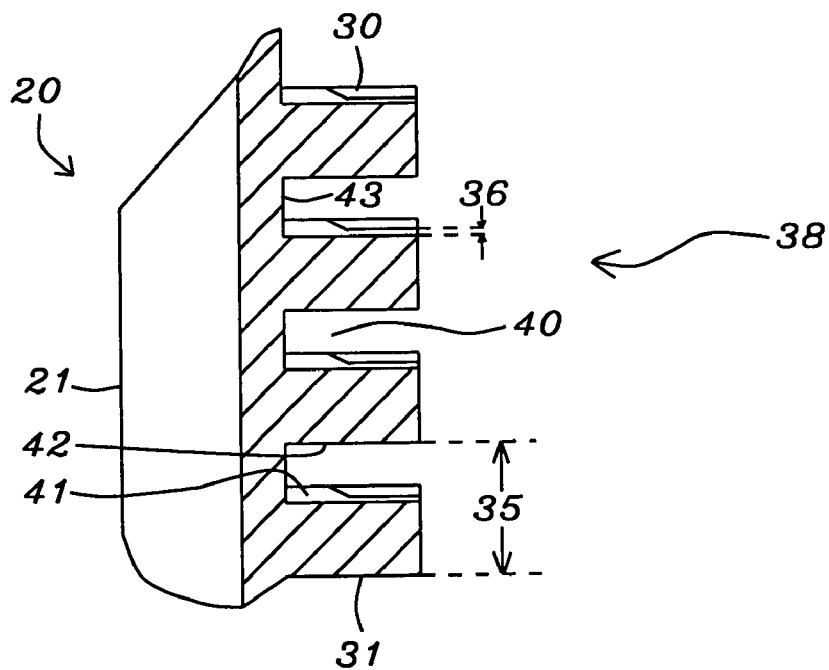
FIG. 8 is an illustration of the invention showing an enlarged fragmented front view of the invention.

Referring to FIGS. 5 and 6 an arcuate curbing member 30 is disposed on a left surface 41 in each of the ⌣ shaped substrate supporting channels 40, including a top end having a thinner sloped portion 36 facing the upper open entrance of cassette 20 letting a substrate pass down through the thinner sloped profile and under a stepped bottom end. The stepped end is perpendicular to the inner surface 38 and prevents the substrate from jutting forward, see FIG. 8. The placement of the arcuate curbing member 30 relative to the substrate 10 is shown in a construction layout in FIG. 7. The arcuate curvatures 32 and 33 of the curbing member 30 are of the same radii as the periphery of substrate 10. The location of the stepped bottom end is placed so that the substrate does not jut out beyond the top edge of the cassette. The edge of the sloped profile is determined to permit the substrate freedom to move to the limit in the X direction which is offset (the difference of the X offset and the wafer diameter). The inner surfaces 41, 42, 43 of the substrate supporting channels 40 are perpendicular to each other and planar.

Figure 9:
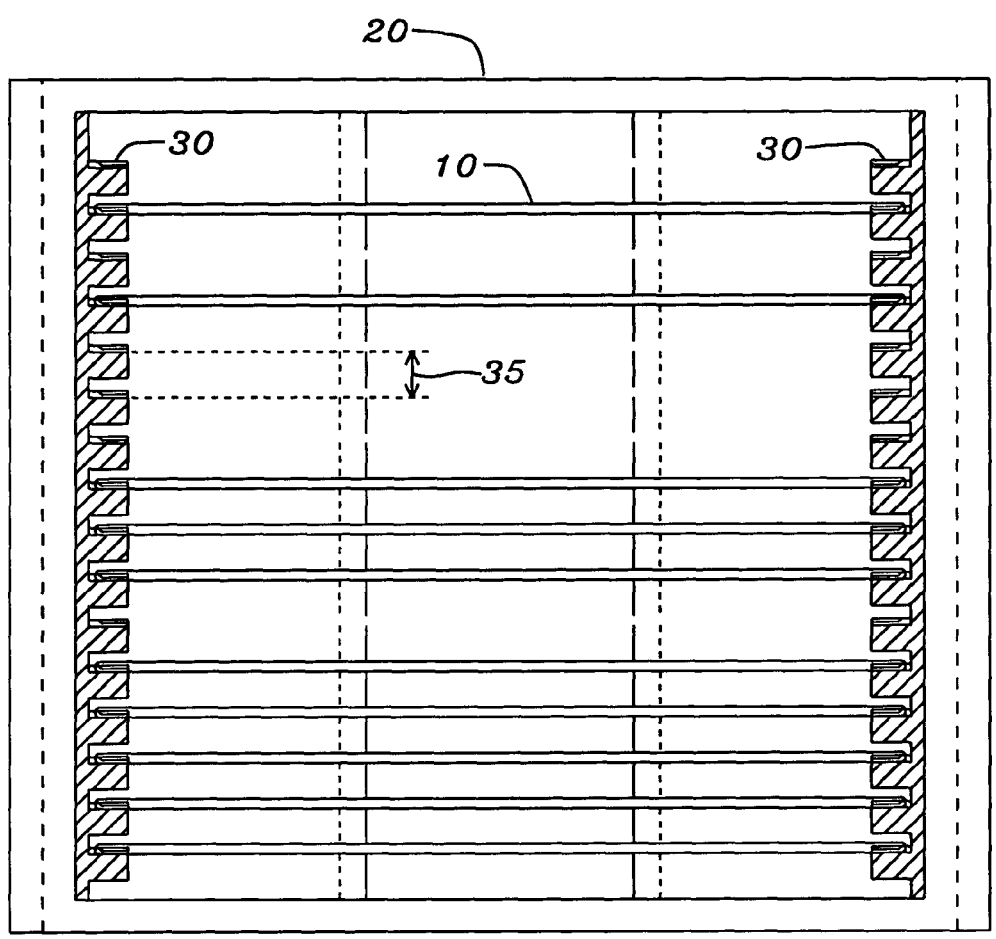
FIG. 9 is a front view illustration of a cassette of the invention.

FIG. 9 illustrates a front view of a cassette 20 in a vertical position showing substrate 10 in a cassette and behind the curbing members 30, all of which are horizontal on the supporting channel planar surfaces. The space 35 between substrates is shown to be consistently uniform for the following reason. Since the supporting channel serves as a horizontal reference plane, substrate over-constraint as posed by the v slot shown in FIG. 1, of the prior art is not a factor. The planar surface allows a substrate to be horizontal by definition, therefore, exposure to stress fracturing or chipping is reduced when bumped as in the case when restrained by the converging apex of a v shaped slot. The supporting channel design and its arcuate curbing member is applicable to all substrate sizes.

While the invention has been particularly shown and described with reference to the preferred embodiment, it will be understood by those skilled in the art that various changes in form and details may be made without departing from the spirit and scope of the inventions.

The invention claimed is:

1. A substrate carrier for securing a plurality of semiconductor substrates, comprising:

a carrier having, axially opposed end partitions and laterally opposed arcuate side panels which are connected with said end partitions to form a four-sided box structure;

spacing of said arcuate side panels by said end partitions to form a substrate entrance on top of said carrier, and a narrowed substrate support opening on the bottom side of said carrier; said arcuate side panels having an inner surface thereof, with an aligned train of substrate support channels for holding substrates in spaced parallel relation, said channels are formed having two side surfaces and a bottom surface, said substrate support channels having a curbing member formed on one side surface of each channel, said curbing member having a lead-in profile that is sloped and truncated enabling a circular substrate to slide into a substrate support channel past said curbing member there-in-after securing said substrate between the channel support surface and said curbing member.

2. The substrate carrier according to claim 1 wherein said substrate support channels are configured to secure substrates in a vertical or horizontal orientation.

3. The substrate carrier according to claim 1 wherein said surfaces of said substrate support channels provide stress free containment of a fragile substrate by providing lateral movement within the channels while said curbing member prevents said substrate from jutting beyond said substrate entrance.

4. The substrate carrier according to claim 3 wherein said substrate support channels having a "U" shape intended to prevent wedging of said substrate's brittle edges, thereby reducing chipping of said brittle edges.

5. The substrate carrier according to claim 1 wherein said sloped and truncated profile of said curbing member prevents substrates from jutting beyond said curbing member.

6. The substrate carrier according to claim 1 wherein a bottom edge of said sloped profile is formed to give the substrate freedom to move laterally.

7. A method for protecting a plurality of semiconductor substrates in a substrate carrier, comprising the steps of:
providing a carrier having,
  axially opposed end partitions and laterally opposed arcuate shaped side panels which are connected to said end partitions to form a four-sided box structure;
  spacing of said arcuate shaped side panels by said end partitions to form a substrate entrance on top of said carrier, and a narrowed substrate support opening on the bottom side of said carrier;
  said side panels having an inner surface thereof, with a train of parallel substrate support channels for supporting substrates in spaced parallel relation, said channels are formed having two side surfaces and a bottom surface,
  said substrate support channels having a curbing member disposed on one side surface of each channel, said curbing member, having a sloped and truncated profile enabling a circular substrate to slide into a substrate support channel, past said curbing member, there-in-after securing said substrate between said substrate support surface and said curbing member.

8. A method according to claim 7 wherein said upper entrance and said substrate support opening providing liquid chemical access to all surfaces of contained substrates.

9. A method according to claim 7 wherein said substrate support channel surfaces are planar thereby permitting unrestrained freedom of the substrates during wet processes and during handling.

10. A method according to claim 7 wherein said shape of said curbing member in operation with said substrate support channel, restricts said substrate from jutting towards said carrier entrance during handling.

11. A method according to claim 7 wherein all the substrate support channels are formed to contain a circular disk of a given diameter, said substrate support channels are equally spaced from one another.

12. A method according to claim 7 wherein said substrate support channels are configured to hold substrates in a vertical orientation.

13. A method according to claim 7 wherein said surfaces of said substrate support channels provide stress free containment of a fragile substrate by providing lateral movement within the channels while said curbing member secures said substrate within said substrate support channel.

14. A method according to claim 13 wherein said substrate support channels having a "U" shape to prevent wedging of said substrate's brittle edges, thereby reducing perimeter chipping.

15. A method according to claim 7 wherein said sloped and truncated profile of said curbing member prevents substrates from jutting beyond said curbing member.

16. A method according to claim 7 wherein a bottom edge of said sloped profile of said curbing member is formed to give a substrate with known physical attributes, freedom to move laterally.

* * * * *